(12) United States Patent
Stein et al.

(10) Patent No.: US 12,176,875 B2
(45) Date of Patent: Dec. 24, 2024

(54) DIGITAL FILTER CIRCUIT, MEASUREMENT INSTRUMENT, AND SIGNAL PROCESSING

(71) Applicant: Rohde & Schwarz GmbH & Co. KG, Munich (DE)

(72) Inventors: Manuel Stein, Munich (DE); Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 789 days.

(21) Appl. No.: 17/370,346

(22) Filed: Jul. 8, 2021

(65) Prior Publication Data
US 2023/0010278 A1    Jan. 12, 2023

(51) Int. Cl.
*H03H 17/02* (2006.01)
*H03H 17/00* (2006.01)

(52) U.S. Cl.
CPC ..... *H03H 17/02* (2013.01); *H03H 2017/0081* (2013.01)

(58) Field of Classification Search
CPC ....................................... H03H 17/02
See application file for complete search history.

(56) References Cited

U.S. PATENT DOCUMENTS

| | | | |
|---|---|---|---|
| 8,644,427 B2 | 2/2014 | Porret et al. | |
| 9,985,608 B2 | 5/2018 | Onkar et al. | |
| 2011/0105068 A1 | 5/2011 | Reddy et al. | |
| 2012/0036947 A1 | 2/2012 | Dobyns et al. | |
| 2012/0288034 A1 | 11/2012 | Fireaizen et al. | |
| 2019/0348970 A1 | 11/2019 | Skinner et al. | |
| 2020/0177165 A1* | 6/2020 | Skinner | H03H 17/0233 |
| 2020/0355729 A1 | 11/2020 | Antonin et al. | |
| 2022/0209805 A1 | 6/2022 | Yu et al. | |

* cited by examiner

*Primary Examiner* — Michael D. Yaary
(74) *Attorney, Agent, or Firm* — CHRISTENSEN O'CONNOR JOHNSON KINDNESS PLLC

(57) ABSTRACT

A digital filter circuit for filtering at least two input signals having different signal data rates is described. The digital filter circuit includes an input multiplexer sub-circuit, a digital filter, and an output multiplexer sub-circuit. The digital filter is connected to the input multiplexer sub-circuit downstream of the input multiplexer sub-circuit. The digital filter is connected to the output multiplexer sub-circuit upstream of the output multiplexer sub-circuit. The input multiplexer sub-circuit is configured to receive the at least two input signals having different signal data rates. The input multiplexer sub-circuit is configured to selectively forward the at least two input signals to the digital filter. The digital filter is configured to filter the at least two input signals, thereby obtaining at least two filtered input signals. The output multiplexer sub-circuit is configured to selectively output the at least two filtered input signals. Further, a measurement instrument and a signal processing method are described.

19 Claims, 3 Drawing Sheets

DIGITAL FILTER CIRCUIT, MEASUREMENT INSTRUMENT, AND SIGNAL PROCESSING

FIELD OF THE DISCLOSURE

Embodiments of the present disclosure generally relate to a digital filter circuit for filtering at least two input signals having different signal data rates. Embodiments of the present disclosure further relate to a measurement instrument and to a signal processing method of processing at least two input signals having different signal data rates.

BACKGROUND

In certain types of measurements, digital signals having different data rates and/or different bandwidths may have to be measured.

In order to process such sets of measurement signals in real time, the different signals having different data rates and/or bandwidths have to be processed essentially simultaneously.

For example, the different signals having different data rates and/or bandwidths may be processed simultaneously by means of two distinct processing units. However, the additional processing units necessary to process the different signals cause additional costs.

Thus, there is a need for a digital filter circuit, a measurement instrument and a signal processing method that allow for processing input signals having different signal data rates in a fast and cost-effective manner.

SUMMARY

Embodiments of the present disclosure provide a digital filter circuit for filtering at least two input signals having different signal data rates. In an embodiment, the digital filter circuit comprises an input multiplexer sub-circuit, a digital filter, and an output multiplexer sub-circuit. The digital filter is connected to the input multiplexer sub-circuit downstream of the input multiplexer sub-circuit. The digital filter is connected to the output multiplexer sub-circuit upstream of the output multiplexer sub-circuit. The input multiplexer sub-circuit is configured to receive the at least two input signals having different signal data rates. The input multiplexer sub-circuit is configured to selectively forward the at least two input signals to the digital filter. The digital filter is configured to filter the at least two input signals, thereby obtaining at least two filtered input signals. The output multiplexer sub-circuit is configured to selectively output the at least two filtered input signals.

The digital filter circuit according to embodiments of the present disclosure provide a possibility to process the at least two input signals having different signal data rates in a particularly effective manner.

This is achieved, for example, by the input multiplexer sub-circuit and the output multiplexer sub-circuit, which selectively forward the different input signals to the digital filter in a predefined manner.

It has been discovered that even input signals having substantially different data rates and/or bandwidths can be efficiently processed by the digital filter circuit according to embodiments of the present disclosure in a parallelized, resource-optimized fashion and with low latency.

Therein, a single digital filter is sufficient to process the at least two input signals having different signal data rates.

Thus, no additional processing units or similar electronic circuitry are necessary, thereby reducing the costs associated with the digital filter circuit.

According to an aspect of the present disclosure, the input multiplexer sub-circuit is configured to selectively forward a single one of the at least two input signals to the digital filter at a time. In other words, a single one of the at least two input signals is processed at a time by the digital filter.

For example, respective portions of the at least two input signals may be forwarded to the digital filter in an alternating manner, such that portions corresponding to different inputs signals are processed by the digital filter in an alternating manner.

The different inputs signals may be assigned the same processing times or rather windows of processing times having equal duration irrespective of the signal data rates of the input signals.

Alternatively, the input multiplexer sub-circuit is configured to selectively forward a single one of the at least two input signals to the digital filter at a time based on the signal data rates of the at least two input signals.

Thus, the different inputs signals may be assigned different processing times or rather different windows of processing time based on the respective signal data rates of the input signals. In some embodiments, input signals having a higher signal data rate may be assigned shorter windows of processing times compared to input signals having a lower signal data rate.

According to another aspect of the present disclosure, the digital filter is switchable between at least two different configurations, wherein the at least two different configurations comprise a first configuration and a second configuration. Each of the at least two configurations may be associated with one of the at least two input signals. In other words, the digital filter may process a first one of the at least two input signals based on a first one of the at least two configurations. The digital filter may process another one of the at least two input signals based on another one of the at least two configurations.

In general, the at least two configurations may be configured such that the digital filter can process each of the at least two input signals with high efficiency, for example with maximum efficiency.

Accordingly, the at least two configurations may depend on a respective signal data rate of a signal to be processed, for example on the respective signal data rates of the at least two input signals.

In an embodiment of the present disclosure, the digital filter is switchable between the at least two different configurations while processing the at least two input signals. Thus, the digital filter may be switched from one configuration to the other each time the digital filter processes another one of the at least two input signals. This way, the configuration best suitable for processing the respective input signals may be chosen for the processing of each of the at least two input signals.

In other words, the digital filter may be switchable on the fly during operation, namely between the processing of signal portions associated with different ones of the at least two input signals.

In a further embodiment of the present disclosure, the first configuration has a predetermined first number of filter taps, wherein the second configuration has a predetermined second number of filter taps, and wherein the first number of filter taps is different from the second number of filter taps. In general, a lower number of filter taps is sufficient for processing input signals having a higher bandwidth (i.e. a higher data rate) than for processing input signals having a lower bandwidth (i.e. a lower data rate).

Without restriction of generality, the first number of filter taps is assumed to be lower than the second number of filter taps in the following.

Accordingly, the digital filter may be configured to employ the first configuration for processing input signals having a lower bandwidth. The digital filter may further be configured to employ the second configuration for processing input signals having a higher bandwidth.

According to a further aspect of the present disclosure, the first configuration has a predetermined first parallelization, wherein the second configuration has a predetermined second parallelization, and wherein the first parallelization is different from the second parallelization. In general, a higher parallelization is desirable for processing input signals having a higher bandwidth (i.e. a higher data rate) than for processing input signals having a lower bandwidth (i.e. a lower data rate).

Without restriction of generality, the first parallelization is assumed to be higher than the second parallelization in the following.

Accordingly, the digital filter may be configured to employ the first configuration for processing input signals having a lower bandwidth. The digital filter may further be configured to employ the second configuration for processing input signals having a higher bandwidth.

In an embodiment of the present disclosure, the first configuration has a predetermined first parallelization, wherein the second configuration has a predetermined second parallelization, wherein the first parallelization is different from the second parallelization, wherein the first number of filter taps is lower than the second number of filter taps, and wherein the first parallelization is higher than the second parallelization.

Thus, the first configuration comprises a lower number of filter taps and a higher parallelization than the second configuration. As explained above, the first configuration therefore is suitable for processing input signals having a higher bandwidth, i.e., a higher data rate, while the second configuration is suitable for processing input signals having a lower bandwidth, i.e., a lower data rate.

In some embodiments, the input multiplexer sub-circuit comprises $2^M$ input channels, wherein M is an integer equal to or greater than 0, for example equal to or greater than 1. Accordingly, the input multiplexer sub-circuit is configured to selectively forward $2^M$ different input signals to the digital filter. At least two of the $2^M$ input signals have signal data rates that are different from each other. The data rates of the other input signals be different from each other and/or may be pairwise equal.

The digital filter may be configured to process $2^P$ digital symbols simultaneously, wherein P is an integer equal to or greater than 0. In other words, the digital filter is configured to generate $2^P$ output samples based on $2^P$ input samples per clock cycle of a system clock of the digital filter.

Therein, the number P corresponds to the parallelization of the digital filter. Accordingly, different configurations of the digital filter may have different parallelizations P associated with them.

According to an aspect of the present disclosure, the input multiplexer sub-circuit comprises $2^M$ input channels, wherein M is an integer equal to or greater than 0, for example equal to or greater than 1, and wherein M and P are adjustable. Accordingly, the input multiplexer sub-circuit is configured to selectively forward $2^M$ different input signals to the digital filter. At least two of the $2^M$ input signals have signal data rates that are different from each other. The data rates of the other input signals be different from each other and/or may be pairwise equal. Moreover, the digital filter is configured to generate $2^P$ output samples based on $2^P$ input samples per clock cycle of a system clock of the digital filter. A user may adapt the number $2^M$ of input channels and the parallelization P in order to adapt the digital filter circuit to the requirements of a specific measurement to be performed.

In an embodiment of the present disclosure, M and P are adjustable under a constraint that the sum of M and P is constant. In other words, the number $2^M$ of input channels and the parallelization P are adaptable under the constraint M+P=K, wherein K is an integer greater than or equal to 1.

According to another aspect of the present disclosure, the digital filter is established as a finite impulse response (FIR) filter. Thus, the digital filter may process the at least two input signals without distorting the phases of the at least two input signals, thereby preserving the phase relations between the at least two input signals.

The digital filter may be established, for example, as a short-length finite impulse response (SFIR) filter. In some embodiments, the digital filter may be established as a SFIR filter at least in one of the configurations of the digital filter described above, for example in the first configuration described above. However, it is to be understood that the digital filter may not be established as a SFIR filter in another one of the at least two configurations described above, for example in the second configuration described above.

In a further embodiment of the present disclosure, the digital filter has re-programmable filter coefficients. In some embodiments, the digital filter may be re-programmable between predefined sets of filter coefficients. The predefined sets of filter coefficients may correspond to the at least two configurations of the digital filter described above.

In some embodiments, the digital filter comprises at least one of an ASIC or an FPGA. Accordingly, the digital filter may be a hardware filter, for example a hardware filter with re-programmable filter coefficients. Thus, the processing speed of the digital filter is considerably higher compared to software-based filter solutions.

According to an aspect of the present disclosure, at least one of the input multiplexer sub-circuit, the digital filter, or the output multiplexer sub-circuit is configured to compensate time delays between the at least two input signals or between the at least two filtered input signals. In general, relative time delays between the at least two input signals, between the at least two filtered input signals, or between different portions of the same (filtered) input signal may be caused by the alternating processing of the at least two input signals by the digital filter circuit. The input multiplexer sub-circuit, the digital filter, and the output multiplexer sub-circuit may be configured to compensate these time delays such that the original phase-relation between the at least two input signals is restored in the at least two filtered input signals.

In some embodiments, the output multiplexer sub-circuit may comprise a buffer memory that is configured to temporarily save the at least two filtered input signals or portions of the at least two filtered input signals. Accordingly, the output multiplexer sub-circuit may be configured to output the at least two input signals saved in the buffer memory such that the time delays are compensated.

In an embodiment of the present disclosure, the input multiplexer sub-circuit is configured to buffer the at least two input signals. The input multiplexer sub-circuit may comprise a buffer memory that is configured to temporarily save the at least two input signals or portions of the at least two input signals. Accordingly, the input multiplexer sub-circuit may be configured to selectively forward signal portions of the at least two input signals saved in the buffer memory to the digital filter circuit.

Embodiments of the present disclosure further provide a measurement instrument, wherein the measurement instrument comprises a digital filter circuit described above.

Regarding the advantages and further properties of the measurement instrument, reference is made to the explanations given above with respect to the digital filter circuit, which also hold for the measurement instrument and vice versa.

In an embodiment of the present disclosure, the measurement instrument is established as an oscilloscope, as a spectrum analyzer, as a signal analyzer, or as a vector network analyzer. Accordingly, the oscilloscope, spectrum analyzer, signal analyzer, or vector network analyzer is configured to process at least two different input signals having different signal data rates.

Embodiments of the present disclosure further provide a signal processing method of processing at least two input signals having different signal data rates. In an embodiment, the signal processing method comprises the following steps:

receiving the at least two input signals having different signal data rates;

selectively forwarding the at least two input signals having different signal data rates to a digital filter;

filtering the at least two input signals by the digital filter, thereby obtaining at least two filtered input signals; and selectively outputting the at least two filtered input signals.

In some embodiments, the digital filter circuit described above and/or the measurement described above may be configured to perform the signal processing method.

Regarding the advantages and further properties of the measurement instrument, reference is made to the explanations given above with respect to the digital filter circuit, which also hold for the measurement instrument and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
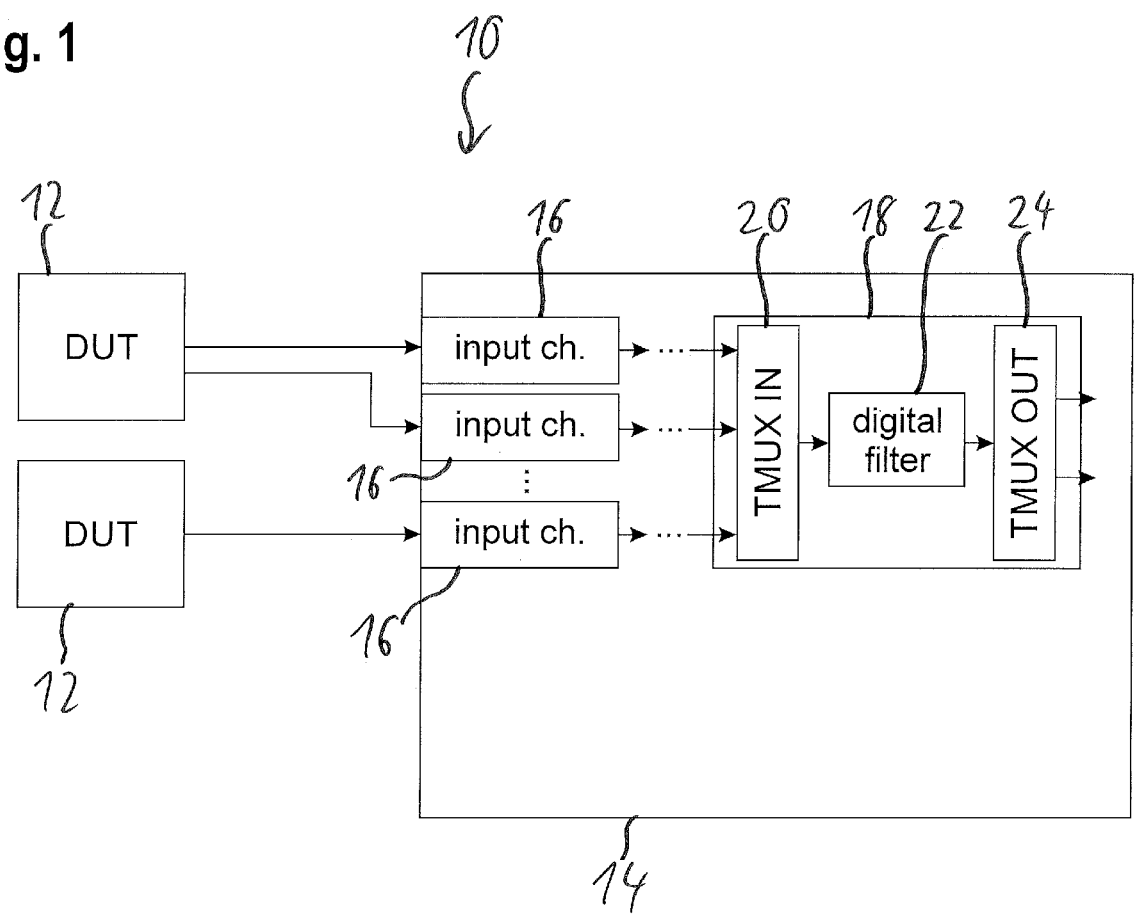
FIG. 1 schematically shows a measurement system with a measurement instrument according to an embodiment of the present disclosure.

FIG. 1 schematically shows an example of a measurement system 10. As shown in FIG. 1, the measurement system 10 comprises one or several devices under test 12, and a measurement instrument 14 connected to the one or several devices under test 12. In general, the measurement instrument 14 is configured to analyze output signals generated by the device(s) under test 12. The measurement instrument 14 may be, for example, an oscilloscope, for example a digital oscilloscope, a spectrum analyzer, a signal analyzer, or a vector network analyzer.

The output signals generated by the device(s) under test 12 may be analog and/or digital output signals, respectively. Accordingly, the measurement instrument 14 is configured to process and analyze the analog output signals and/or the digital output signals generated by the device(s) under test 12.

In embodiments of the present disclosure, the measurement instrument 14 comprises at least two input channels 16 and a digital filter circuit 18 that is connected to the input channels 16 downstream of the input channels 16.

In some embodiments, the term "circuit" refers to or includes, inter alia, a combination of hardware (e.g. a processor such as an integrated circuit, digital circuits or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

The digital filter circuit 18 comprises an input multiplexer sub-circuit 20, a digital filter 22, and an output multiplexer sub-circuit 24. The input multiplexer sub-circuit 20 is connected to the input channels 16 downstream of the input channels 16. The digital filter 22 is interconnected between the input multiplexer sub-circuit 20 and the output multiplexer sub-circuit 24.

The digital filter 22 is established, for example, as a finite impulse response (FIR) filter with re-programmable filter coefficients, as will be described in more detail hereinafter. In some embodiments, the digital filter 22 is established as a hardware filter with re-programmable filter coefficients.

Figure 2:
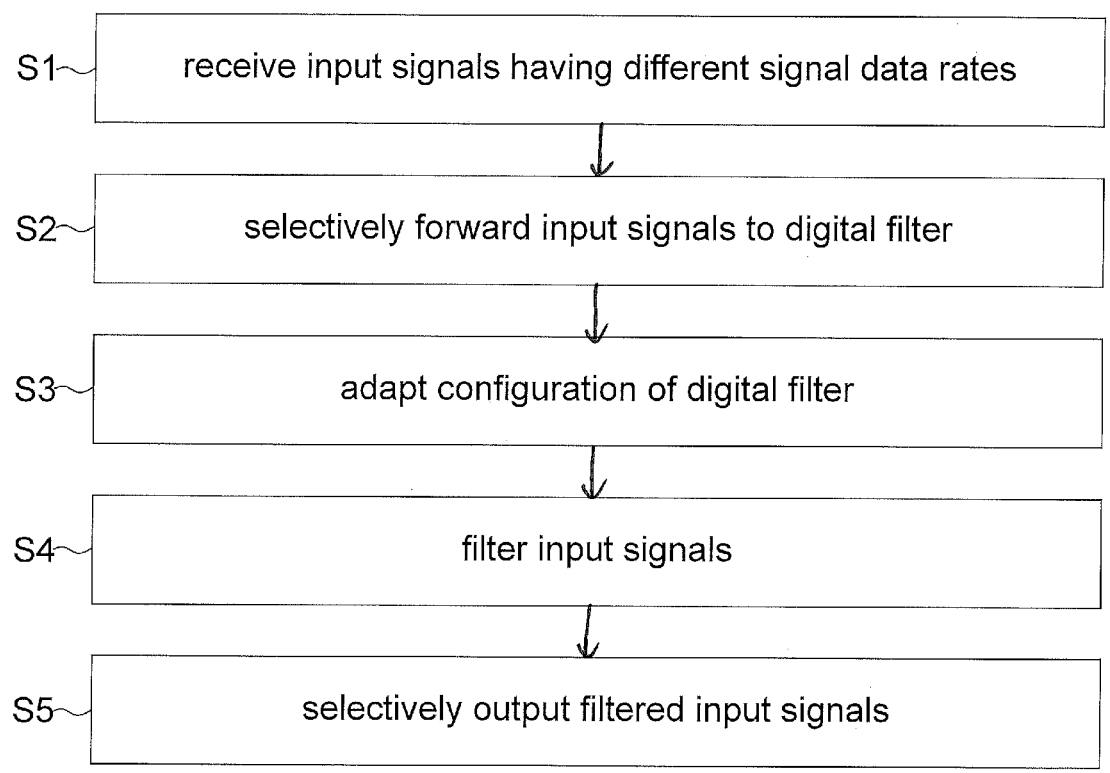
FIG. 2 shows a flow chart of a signal processing method according to an embodiment of the present disclosure.

The measurement instrument 14 is configured to perform a signal processing method of processing at least two input signals having different signal data rates. An example of the signal processing method is described in the following with reference to FIG. 2.

At least two input signals are received by the input channels 16, wherein the at least two input signals have different signal data rates and thus different bandwidths (step S1).

The input signals received correspond to the output signals generated by the device(s) under test 12. Therein, the at least two input signals may originate from different devices under test 12 or from the same device under test 12.

If at least one of the at least two output signals generated by the device(s) under test 12 is an analog output signal, the respective analog output signal may be digitized by an analog-to-digital converter of the associated input channel 16, thereby generating a corresponding digitized input signal. Thus, the at least two input signals processed by the measurement instrument 14 downstream of the input channels 16 are digital input signals.

The signal data rates of the at least two input signals may typically be in a range between 1 GS/s and 20 GS/s. However, it is to be understood that lower and/or higher signal data rates are also possible.

The at least two input signals are forwarded to the digital filter circuit 18. Optionally, the at least two input signals may be pre-processed by further electronic components of the measurement instrument 14 before being forwarded to the digital filter circuit 18.

The at least two input signals are selectively forwarded to the digital filter 22 by the input multiplexer sub-circuit 20, such that a single one of the at least two input signals is forwarded to the digital filter 22 at a time (step S2).

Figure 3:
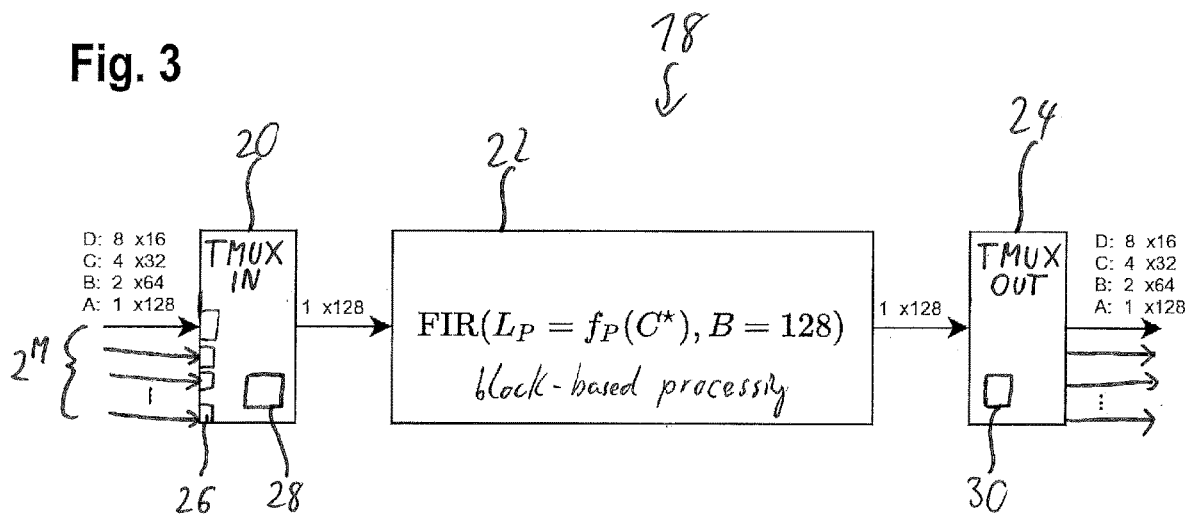
FIG. 3 shows a first configuration of a digital filter circuit according to an embodiment of the present disclosure.

As is illustrated in FIG. 3, the input multiplexer sub-circuit 20 may comprise $2^M$ input channels 26, wherein M is an integer equal to or greater than 0, for example equal to or greater than 1. Accordingly, the input multiplexer sub-circuit 20 receives $2^M$ input signals simultaneously.

The input multiplexer sub-circuit 20 comprises a buffer memory 28 that is configured to temporarily save the at least two input signals or portions of the at least two input signals received from the input channels 16. Accordingly, the input multiplexer sub-circuit 20 may selectively forward signal portions of the at least two input signals saved in the buffer memory 28 to the digital filter circuit. In some embodiments, respective portions of the at least two input signals may be forwarded to the digital filter 22 in an alternating manner.

A configuration of the digital filter 22 is adapted based on the signal data rate of the input signal currently forwarded to the digital filter 22 (step S3).

The digital filter 22 is switchable between at least two different configurations that each comprise a different set of filter coefficients. Each of the at least two configurations may be associated with one of the at least two input signals. Accordingly, each of the at least two configurations may comprise filter coefficients that are particularly suitable to process one of the at least two input signals.

The at least two different configurations comprise a first configuration and a second configuration. Thus, the configuration of the digital filter 22 may be adapted to the first configuration if a first one of the at least two input signals is forwarded to the digital filter 22 momentarily. The configuration of the digital filter 22 may be adapted to the second configuration if a second one of the at least two input signals is forwarded to the digital filter 22 momentarily.

Figure 4:
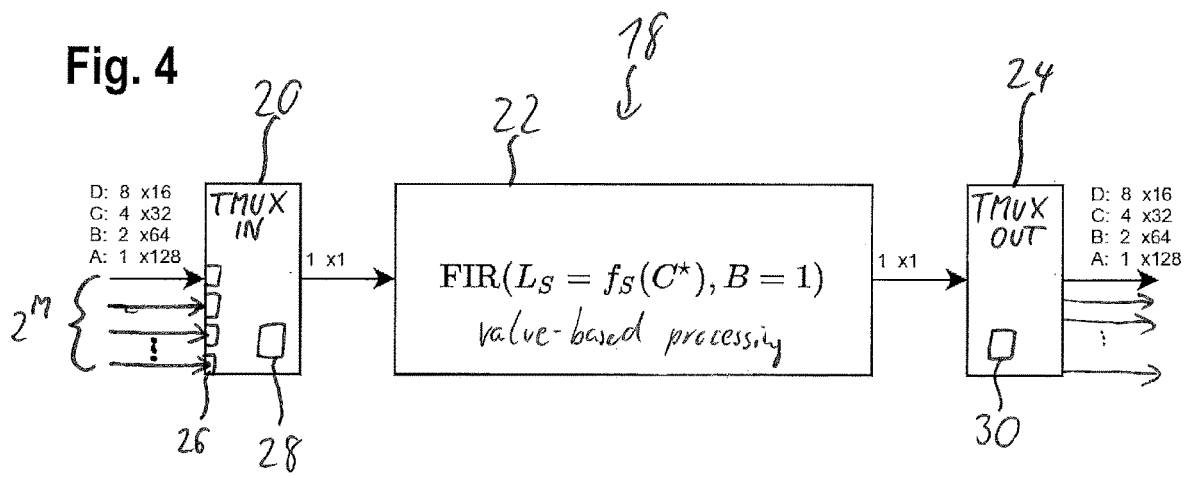
FIG. 4 shows a second configuration of a digital filter circuit according to an embodiment of the present disclosure.

The first configuration shown in FIG. 3 has a predetermined first number $L_P$ of filter taps, and the second configuration shown in FIG. 4 has a predetermined second number $L_S$ of filter taps.

The first number $L_P$ of filter taps is different from the second number $L_S$ of filter taps. In general, a lower number of filter taps is sufficient for processing input signals having a higher bandwidth (i.e. a higher data rate) than for processing input signals having a lower bandwidth (i.e. a lower data rate).

Without restriction of generality, the first number $L_P$ of filter taps is assumed to be lower than the second number $L_S$ of filter taps in the following. For example, the first number $L_P$ of filter taps may be about 64. The second number $L_S$ of filter taps may be about 324.

Moreover, the first configuration has a predetermined first parallelization $P_1$, and the second configuration has a predetermined second parallelization $P_2$. This means that the digital filter 22 is configured to process $B=2^{P_1}$ digital symbols simultaneously in the first configuration and $B=2^{P_2}$ digital symbols simultaneously in the second configuration. In other words, the digital filter 22 is configured to generate $2^{P_1}$ or $2^{P_2}$ output samples based on $2^{P_1}$ or $2^{P_2}$ input samples per clock cycle of a system clock of the digital filter 22, respectively.

The first parallelization $P_1$ is different from the second parallelization $P_2$. In general, a higher parallelization is desirable for processing input signals having a higher bandwidth (i.e. a higher data rate) than for processing input signals having a lower bandwidth (i.e. a lower data rate).

Without restriction of generality, the first parallelization is assumed to be higher than the second parallelization. For example, the first parallelization $P_1$ and the second parallelization $P_2$ may each be between 0 and 8. However, it is to be understood that higher parallelizations are also possible.

In the embodiment of FIG. 3, the parallelization $P_1$ is 7, such that $B=2^7=128$ symbols are processed in parallel. In the example of FIG. 4, the parallelization $P_2$ is 0, such that $B=2^0=1$ symbol is processed.

Optionally, M and P of the digital filter 22 may be adjustable under a constraint that the sum of M and P is constant. In other words, the number $2^M$ of input channels 26 and the parallelization P are adaptable under the constraint M+P=K, wherein K is an integer greater than or equal to 1.

Summarizing, the first configuration has a shorter filter length, but a higher parallelization. This way, a whole block of symbols can be processed at the same time. This may also be referred to as "block-based processing". The second configuration has a longer filter length, but lower parallelization. This way, only a single symbol or few symbols are processed at the same time. This may also be referred to as "value-based processing".

In other words, the digital filter 22 can be switched between block-based processing and value-based processing on the fly. In some embodiments, the digital filter 22 may be switched to the first configuration for processing input signals having a lower bandwidth. The digital filter 22 may be switched to the second configuration for processing input signals having a higher bandwidth. Thus, the filter configuration being best suitable for processing the respective input signal is chosen for the digital filter 22.

For this purpose, the at least two input signals may be categorized into one of at least two categories, for example into the two categories "narrow-band signal" and "broadband signal".

One possible criterion for the categorization is to check for each input signal whether the inequality $$\text{RATE}_{IN}^{(m)} = \frac{P^{(m)}}{R^{(m)}} > \frac{1}{M}$$

is fulfilled. Therein, $P^{(m)}$ is the parallelization associated with channel number m, and $R^{(m)}$ is a decimation factor associated with channel number m.

If this inequality is fulfilled, then the corresponding input signal is categorized as a broad-band signal. Accordingly, the digital filter 22 may be switched to the first configuration in this case.

If this inequality is not fulfilled, then the corresponding input signal is categorized as a narrow-band signal. Accordingly, the digital filter 22 may be switched to the second configuration in that case.

The at least two input signals are filtered by the digital filter 22, thereby generating at least two filtered input signals (step S4).

As only a single one of the input signals is forwarded to the digital filter 22 filters at a time, only a single one of the input signals is processed by the digital filter 22 at a time. For example, the digital filter 22 processes the at least two input signals in an alternating manner, wherein each input signal is processed for one clock cycle of the system clock of the digital filter 22, respectively. However, the digital filter 22 may process the at least two input signals in an alternating manner for more than one clock cycle of the system clock of the digital filter 22, respectively.

The at least two filtered input signals are forwarded to the output multiplexer sub-circuit 24. The at least two filtered input signals are selectively output by the output multiplexer sub-circuit 24 (step S5).

The output multiplexer sub-circuit 24 may comprise a buffer memory 30 that is configured to temporarily save the at least two filtered input signals or portions of the at least two filtered input signals. Accordingly, the output multiplexer sub-circuit 24 may output the at least two filtered input signals or portions of the at least two filtered input signals saved in the buffer memory 30.

This way, time delays introduced by the alternating processing of the filtered input signals by the input multiplexer sub-circuit 20 and the digital filter 22 are compensated. Accordingly, the output multiplexer sub-circuit 24 may be configured to output the at least two input signals saved in the buffer memory such that time delays of filtered input signal portions associated with the same input signal and/or with different input signals are compensated.

With the measurement instrument 14 and the signal processing method described above, even input signals having substantially different data rates and/or bandwidths can be efficiently processed by the digital filter circuit described above in a parallelized, resource-optimized fashion and with low latency.

Therein, a single digital filter 22 is sufficient to process the at least two input signals having different signal data rates, as the digital filter 22 comprises at least two configurations that are suitable for processing input signals having different signal data rates.

Thus, no additional processing units or similar electronic circuitry are necessary for processing input signals having different signal data rates, thereby reducing the costs associated with the digital filter circuit 18 and with the measurement instrument 14.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A digital filter circuit for filtering at least two input signals having different signal data rates, comprising an input multiplexer sub-circuit, a digital filter, and an output multiplexer sub-circuit,
   wherein the digital filter is connected to the input multiplexer sub-circuit downstream of the input multiplexer sub-circuit;
   wherein the digital filter is connected to the output multiplexer sub-circuit upstream of the output multiplexer sub-circuit;
   wherein the input multiplexer sub-circuit is configured to receive the at least two input signals having different signal data rates;
   wherein the input multiplexer sub-circuit is configured to selectively forward the at least two input signals to the digital filter;
   wherein the digital filter is configured to filter the at least two input signals, thereby obtaining at least two filtered input signals;
   wherein the output multiplexer sub-circuit is configured to selectively output the at least two filtered input signals; and
   wherein the input multiplexer sub-circuit comprises $2^M$ input channels, wherein M is an integer equal to or greater than 1.

2. The digital filter circuit of claim 1, wherein the input multiplexer sub-circuit is configured to selectively forward a single one of the at least two input signals to the digital filter at a time.

3. The digital filter circuit of claim 1, wherein the digital filter is switchable between at least two different configurations, wherein the at least two different configurations comprise a first configuration and a second configuration.

4. The digital filter circuit of claim 3, wherein the digital filter is switchable between the at least two different configurations while processing the at least two input signals.

5. The digital filter circuit of claim 3, wherein the first configuration has a predetermined first number of filter taps, wherein the second configuration has a predetermined second number of filter taps, and wherein the first number of filter taps is different from the second number of filter taps.

6. The digital filter circuit of claim 3, wherein the first configuration has a predetermined first parallelization, wherein the second configuration has a predetermined second parallelization, and wherein the first parallelization is different from the second parallelization.

7. The digital filter circuit of claim 5, the first configuration has a predetermined first parallelization, wherein the second configuration has a predetermined second parallelization, wherein the first parallelization is different from the second parallelization, wherein the first number of filter taps is lower than the second number of filter taps, and wherein the first parallelization is higher than the second parallelization.

8. The digital filter circuit of claim 1, wherein the digital filter is configured to process $2^P$ digital symbols simultaneously, wherein P is an integer equal to or greater than 0.

9. The digital filter circuit of claim 8, wherein M and P are adjustable.

10. The digital filter circuit of claim 9, wherein M and P are adjustable under a constraint that the sum of M and P is constant.

11. The digital filter circuit of claim 1, wherein the digital filter is established as a finite impulse response (FIR) filter.

12. The digital filter circuit of claim 11, wherein the digital filter is established as a short-length finite impulse response (SFIR) filter.

13. The digital filter circuit of claim 1, wherein the digital filter has re-programmable filter coefficients.

14. The digital filter circuit of claim 1, wherein the digital filter comprises at least one of an ASIC or an FPGA.

15. The digital filter circuit of claim 1, wherein at least one of the input multiplexer sub-circuit, the digital filter, or the output multiplexer sub-circuit is configured to compensate time delays between the at least two input signals or between the at least two filtered input signals.

16. The digital filter circuit of claim 1, wherein the input multiplexer sub-circuit is configured to buffer the at least two input signals.

17. A measurement instrument, comprising a digital filter circuit according to claim 1.

18. The measurement instrument of claim 17, wherein the measurement instrument is established as an oscilloscope, as a spectrum analyzer, as a signal analyzer, or as a vector network analyzer.

19. A signal processing method of processing at least two input signals having different signal data rates by a digital filter circuit, the digital filter circuit comprising an input multiplexer sub-circuit, a digital filter, and an output multiplexer sub-circuit, wherein the input multiplexer sub-circuit comprises $2^M$ input channels, wherein M is an integer equal to or greater than 1, the signal processing method comprising:
   receiving, by the input multiplexer sub-circuit, the at least two input signals having different signal data rates;
   selectively forwarding, by the input multiplexer sub-circuit, the at least two input signals having different signal data rates to the digital filter;
   filtering the at least two input signals by the digital filter, thereby obtaining at least two filtered input signals; and
   selectively outputting, by the output multiplexer sub-circuit, the at least two filtered input signals.

* * * * *